United States Patent [19]

Blanz

[11] Patent Number: 5,160,883
[45] Date of Patent: Nov. 3, 1992

[54] TEST STATION HAVING VIBRATIONALLY STABILIZED X, Y AND Z MOVABLE INTEGRATED CIRCUIT RECEIVING SUPPORT

[75] Inventor: John H. Blanz, Carlisle, Mass.

[73] Assignee: John H. Blanz Company, Inc., Carlisle, Mass.

[21] Appl. No.: 535,419

[22] Filed: Jun. 8, 1990

Related U.S. Application Data

[62] Division of Ser. No. 431,572, Nov. 3, 1989, Pat. No. 5,097,207.

[51] Int. Cl.$^5$ ............... G01R 31/02; F16C 32/06; B25B 11/00
[52] U.S. Cl. .................. 324/158 F; 269/21; 384/12; 324/158 P
[58] Field of Search ............ 324/158 F, 158 P, 73.1; 269/21; 384/12

[56] References Cited

U.S. PATENT DOCUMENTS

| | | |
|---|---|---|
| 3,361,195 | 1/1968 | Meyerhoff et al. .............. 165/80 |
| 3,412,333 | 11/1968 | Frick et al. .................... 324/158 |
| 3,437,929 | 4/1969 | Glenn ......................... 324/158 |
| 3,476,444 | 11/1969 | Dunfee ........................ 308/3.5 |
| 3,524,497 | 8/1970 | Chu et al. ..................... 165/80 |
| 3,710,251 | 1/1973 | Hagge et al. ................ 324/158 F |
| 3,781,069 | 12/1973 | Gluchowicz ................... 308/5 R |
| 3,831,283 | 8/1974 | Pagella et al. .................. 33/174 R |
| 3,842,346 | 10/1974 | Bobbitt ........................ 324/73 R |
| 3,953,013 | 4/1976 | Griffith et al. .................. 269/21 |
| 4,013,280 | 3/1977 | Chitayat et al. ................. 269/60 |
| 4,104,589 | 8/1978 | Baker et al. ................ 324/158 F |
| 4,114,096 | 9/1978 | Chinery ..................... 324/158 D |
| 4,172,993 | 10/1979 | Leach ....................... 324/158 F |
| 4,190,240 | 2/1980 | Peterson ....................... 269/21 |
| 4,408,464 | 10/1983 | Salour et al. .................. 62/514 R |
| 4,413,863 | 11/1983 | Lombard ..................... 308/5 R |
| 4,413,864 | 11/1983 | Phillips ...................... 308/5 R |
| 4,417,770 | 11/1983 | Tucker ....................... 308/3.5 |
| 4,455,910 | 6/1984 | Kraft et al. .................... 83/874 |
| 4,457,566 | 7/1984 | Mohsin ...................... 308/5 R |
| 4,468,616 | 8/1984 | Yoshizaki ................... 324/158 F |
| 4,496,194 | 1/1985 | Phillips ...................... 308/5 R |
| 4,498,046 | 2/1985 | Faris et al. .................. 324/158 F |
| 4,503,335 | 3/1985 | Takahashi ..................... 250/548 |
| 4,517,253 | 5/1985 | Rose et al. ..................... 428/620 |

(List continued on next page.)

OTHER PUBLICATIONS

Bergles, A. E.; "Two-Piece Cold Plate With Corrugated Heat Transfer Surface", IBM Tech. Dis. Bull.; vol. 22, No. 8A; Jan. 1980, pp. 3318-3319.
Christensen, R. G.; "Water-Cooled Heat Transfer Plate"; IBM Tech. Dis. Bull.; vol. 23, No. 4; Sep. 1980, pp. 1445-1446.
"Fluid Cooled Spiral Vortex Cold Plate"; Research Disclosure; Apr. 1985, No. 252; one page.

Primary Examiner—Ernest F. Karlsen
Attorney, Agent, or Firm—Weingarten, Schurgin, Gagnebin & Hayes

[57] ABSTRACT

ATE is mounted directly to a support surrounding and removably receiving probe cards of differing thickness. An electrically heated chuck having a variable heat transfer coefficient heat exchanging face confronting a liquid nitrogen supplied plenum exhibits a temperature that varies with electrical heater load, rate of liquid nitrogen supply, and heat transfer coefficient of the heat exchanging face. The rate of liquid nitrogen supply is varied as a function of whether or not the electrical heater load falls outside predetermined upper and lower bounds to establish and maintain set point temperature over a range of set point temperatures including liquid nitrogen temperature and ambient temperature. The chuck is mounted for X,Y movement on load-balanced air/vacuum bearing, and is mounted for Z movement to accommodate different thickness probe cards. A loadlock having a pivoting cassette receiving tray that pivots with a pivoting transfer arm is mounted for Z movement with the chuck. A vacuum pump selectively lowers the temperature at which the supplied liquid nitrogen boils. A positive pressure of $N_2$ gas is maintained to prevent moisture condensation in the load-lock and on the operative surfaces of the chuck.

8 Claims, 6 Drawing Sheets

U.S. PATENT DOCUMENTS

| | | | |
|---|---|---|---|
| 4,519,389 | 5/1985 | Gudkin et al. | 128/303.1 |
| 4,532,423 | 7/1985 | Tojo et al. | 250/310 |
| 4,546,619 | 10/1985 | Rohner | 62/419 |
| 4,558,909 | 12/1985 | Stauber | 308/5 R |
| 4,567,432 | 1/1986 | Buol et al. | 324/158 F |
| 4,605,893 | 8/1986 | Braslau | 324/58.5 B |
| 4,615,568 | 10/1986 | Kober | 384/12 |
| 4,627,362 | 12/1986 | Ise et al. | 104/23.2 |
| 4,643,590 | 2/1987 | Olasz | 384/8 |
| 4,653,408 | 3/1987 | Nagashima et al. | 108/20 |
| 4,658,601 | 4/1987 | Burchell et al. | 62/514 R |
| 4,704,712 | 11/1987 | Siryj | 369/249 |
| 4,717,263 | 1/1988 | Phillips | 384/12 |
| 4,719,705 | 1/1988 | Laganza et al. | 33/568 |
| 4,747,450 | 5/1988 | Ikegame et al. | 165/168 |
| 4,747,589 | 5/1988 | Watson et al. | 269/21 |
| 4,757,255 | 7/1988 | Margozzi | 324/158 F |
| 4,799,009 | 1/1989 | Tada et al. | 324/158 P |
| 4,799,543 | 1/1989 | Iversen et al. | 165/135 |
| 4,856,904 | 8/1989 | Akagawa | 324/158 F |
| 4,954,744 | 9/1990 | Binet | 324/158 F |

TEST STATION HAVING VIBRATIONALLY STABILIZED X, Y AND Z MOVABLE INTEGRATED CIRCUIT RECEIVING SUPPORT

This application is a division of application Ser. No. 07/431,572, filed Nov. 3, 1989, now U.S. Pat. No. 5,097,207.

FIELD OF THE INVENTION

This invention is directed to the field of semiconductor testing, and more particularly, to a new and improved cryogenic probe station.

BACKGROUND OF THE INVENTION

A plurality of integrated circuit devices are manufactured in well-known manner in and on a single wafer of semiconductor or other material. Prior to slicing the wafer to free each of the integrated circuit devices for encapsulation, predetermined test sequences are run on each on-wafer integrated circuit device to determine if each device is operating in its intended manner. A probe card, which has a plurality of depending electrode fingers configured to conform to the particular geometry of the integrated circuit devices manufactured on the wafer, is connected to automatic testing equipment (ATE) which runs the predetermined test sequences. The wafer and probecard are moved relatively to each other until all of the integrated circuit devices on the substrate have been tested by the ATE.

Certain classes of integrated circuit devices are intended for operation at temperatures other than ambient temperature, and cryogenic and other probe stations are known that are operative to provide testing of such integrated circuit devices at the cryogenic and other temperatures at which these integrated circuit devices are intended to operate. In one such heretofore known cryogenic test station, an enclosure is provided having a top opening and a removable optical window. A spring-loaded slide mechanism is provided in the enclosure proximate the opening for receiving the probecard. A micrometer adjustment head is provided that cooperates with the spring-loaded slide for accommodating differing thickness probecards. A chuck is provided that is movable subjacent the probecard for receiving the semiconductor wafer having the integrated circuit devices thereon to be tested. The chuck is provided with openings therein for receiving resistive heating elements, and is provided with a plenum for allowing liquid nitrogen to boil therein. The plenum is connected to a source of liquid nitrogen via an input flow conduit, and is connected to ambient via an output flow conduit. Three different exhausts of varying orifice size are provided in the output flow conduit for selecting three different liquid nitrogen flow rates and corresponding high, medium, and low-temperature regimes. A temperature sensor is provided for sensing the chuck temperature and a temperature controller responsive to the temperature of the chuck is provided for controlling the heat supplied by the resistive elements. The three different exhausts provide gross temperature control in the selected one of the high, medium, and low-temperature regimes, and the resistive elements provide fine temperature control to a predetermined temperature stability within any given regime of gross temperature control. A θ actuator is provided for rotating the chuck, a Z-actuator is provided for moving the chuck up and down, and an X,Y table mounted on ball-bushings is provided for stepping the chuck in the plane of the chuck. A single-wafer load-lock is provided for inserting a wafer to be tested into and for removing a wafer after testing out of the cryogenic test station. The load-lock is provided with a pivoting top cover through which the wafer is inserted and removed that opens to ambient, and a sliding door is provided between the load-lock and the chuck of the cryogenic station. A single-wafer vacuum-pickup arm is provided for linearly moving the substrates between the top surface of the chuck and the load-lock. The load-lock and the enclosure of the station are provided with a positive pressure nitrogen environment for preventing moisture condensation on the cold test surfaces of the cryogenic testing station.

SUMMARY OF THE INVENTION

The objects of the present invention represent several improvements over the heretofore known cryogenic probe station.

One object that is disclosed by the present invention is an improved apparatus for receiving the probecard and for supporting ATE to which the probe card is connected. In accord with this object, the probecard is received in a generally flush relation to the open top of the test station, thereby enabling an ease of card placement and removal, and is mounted to structural members of the test station. ATE placed in proximity to the probecard is supported by the structural members of the test station, thereby enabling an ease of ATE set-up and take-down.

Another object that is disclosed by the present invention is an improved apparatus having members extending from the chuck into the plenum of the chuck for providing different conductive heat transport rates between the liquid nitrogen that is flowed through the plenum and the chuck. In accord with this object, conductive heat transport off the chuck is selectively available in different degrees, thereby enabling better control of the temperature of the chuck.

Another object that is disclosed by the present invention is an improved apparatus responsive to the resistance heaters load and connected to a variable orifice positioned in the input flow conduit for controlling the size of the variable orifice, and therewith the rate of liquid nitrogen flow, in dependence on whether or not the load is within predetermined bounds. In accord with this object, the predetermined bounds for maximum stability of set point temperature are determined such that the deadband defined between the bounds is enough to maintain any set point temperature with the resistance heaters load alone being varied between the bounds, thereby minimizing the liquid nitrogen flow rate for each set point temperature.

A further object that is disclosed by the present invention is an improved apparatus allowing the chuck to move on an air bearing in X and Y to any X, Y position, and for holding the chuck absolutely stable in Z at that X, Y, position, thereby enabling jitter-free testing of the integrated circuit devices borne by the wafer. In accord with this object, the chuck is mounted for movement with a load-balanced air/vacuum bearing that itself rides on a single, precision-finished surface plate, and in such a way that no other member but the surface plate is required to mechanically constrain the air/vacuum bearing.

Another object that is disclosed by the present invention is an improved apparatus for adjusting the surface plate in Z in order to accommodate different thickness probecards. In accord with this object, a manually and-/or an automatically adjustable lifting and lowering mechanism is coupled between the surface plate and structural members of the cryogenic test station.

A further object that is disclosed by the present invention is an improved apparatus for achieving a lower minimum set-point temperature than has been available from the hithertoknown cryogenic probe station. In accordance with this object, a vacuum pump is selectively couplable to the fluid flow output conduit the negative pressure of which lowers the boiling point and thereby the temperature at which the liquid nitrogen supplied to the plenum boils.

Another object that is disclosed by the present invention is an improved apparatus for holding plural wafers all at once in the load-lock and for transferring any selected wafer singly to the chuck for testing and back to the load-lock after the integrated circuits thereon have been tested. In accord with this object, a cassette-load of wafers is received in a pivotable carrier, and a pivoting transfer arm cooperates with the pivotable carrier to transfer wafers between the load-lock and the chuck.

BRIEF DESCRIPTION OF THE DRAWINGS

Other objects, advantages, and features of the present invention will become apparent as the invention becomes better understood by referring to the following detailed description of the preferred embodiments thereof, and to the drawings, wherein.

DETAILED DESCRIPTION OF THE PREFERRED EMBODIMENTS

Figure 1:
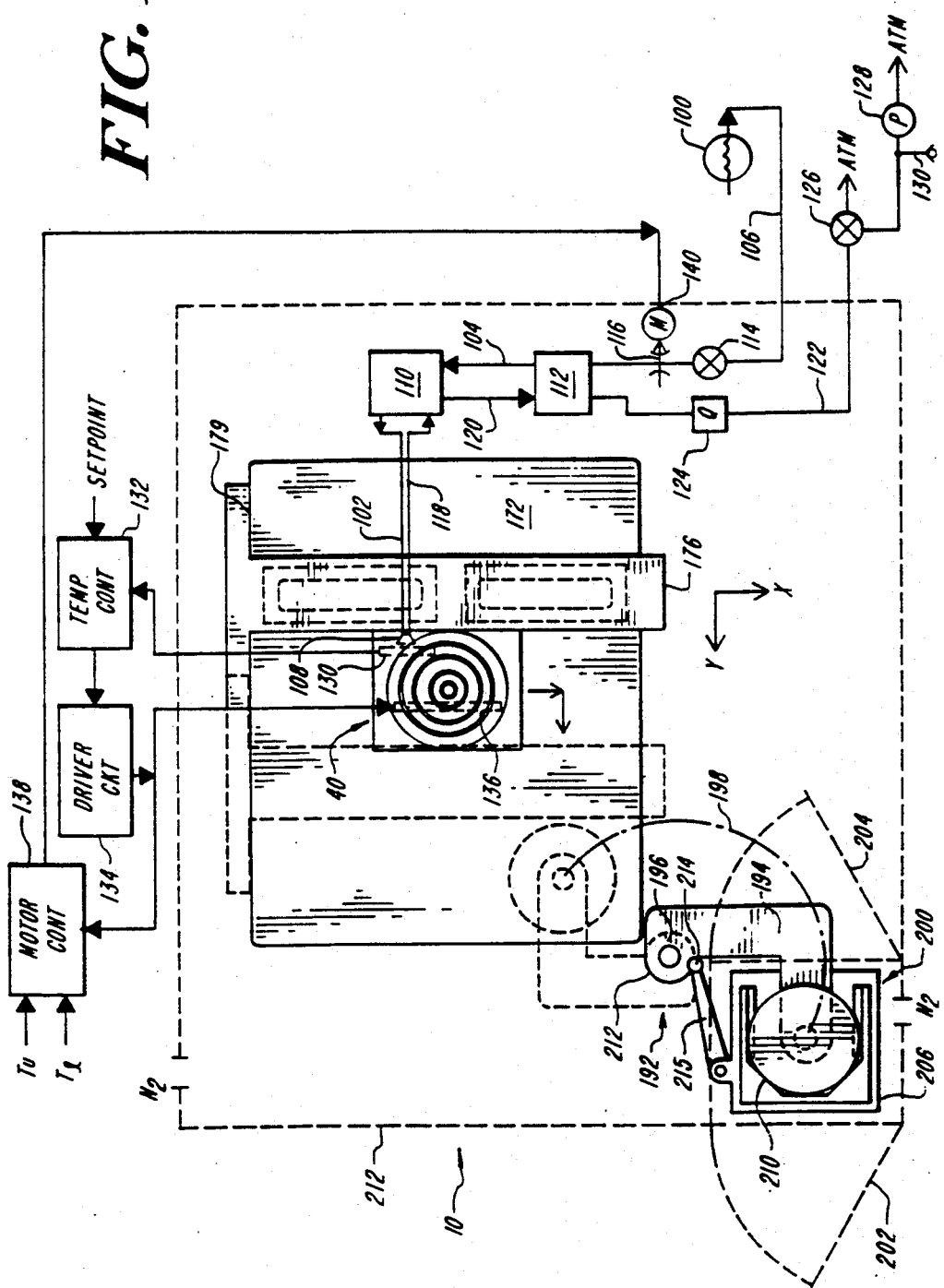
FIG. 1 is a partially pictorial plan view of the improved cryogenic probe station of the present invention.
Figure 2:
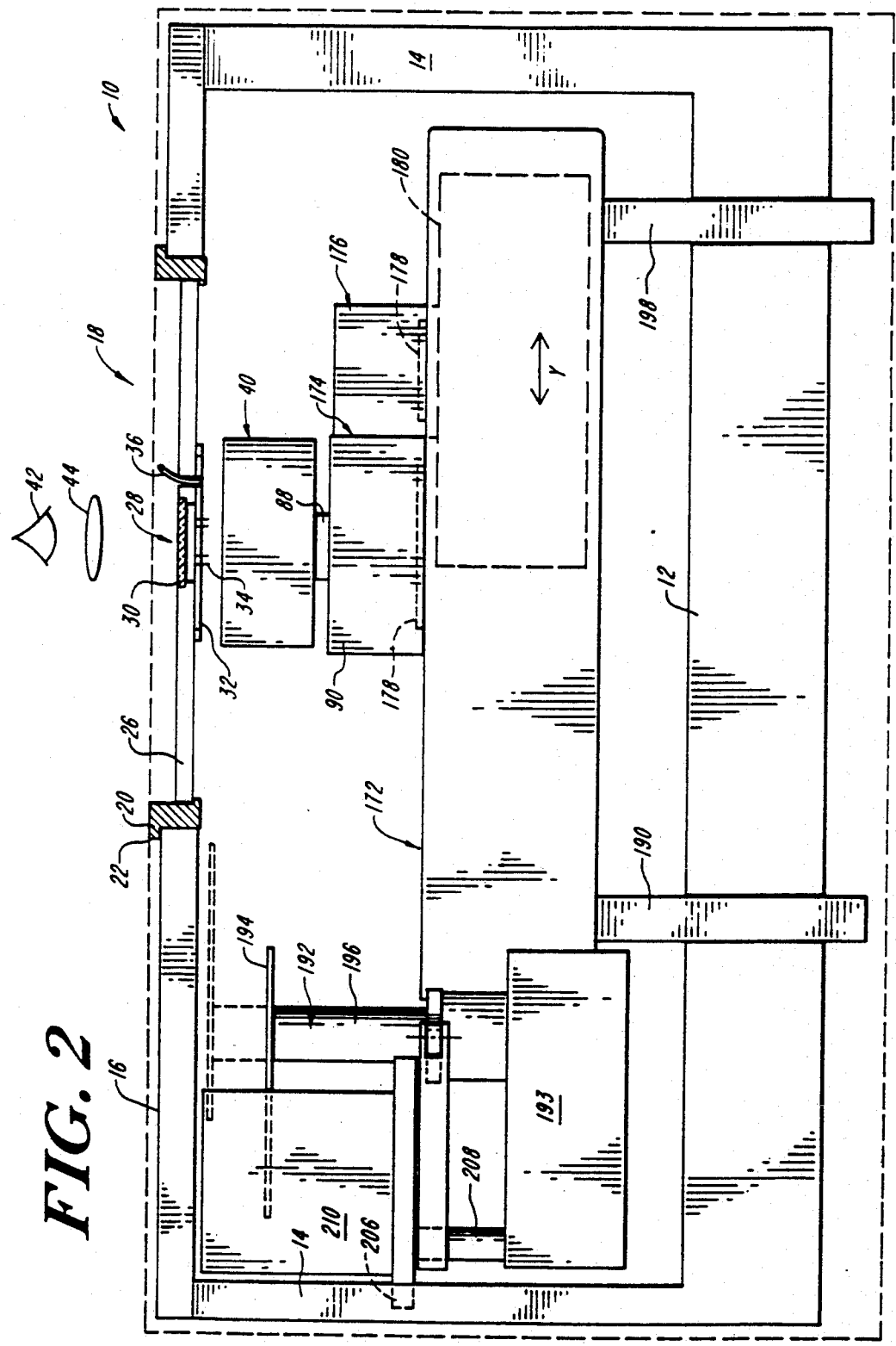
FIG. 2 is a partially pictorial side elevation of the improved cryogenic probe station of the present invention.

Referring now to FIGS. 1 and 2, and primarily to FIG. 2, generally designated at 10 is the improved cryogenic probe station of the present invention. The station 10 includes structural members defining bottom frame 12, four upstanding side columns 14 joined to the bottom frame 12, and defining a top plate 16 having an opening generally designated 18 provided therethrough. A tooling ring 20 having an outwardly radially extending flange 22 and an inwardly radially extending flange 24 is rotatably mounted in the opening 18 provided therefor in the top plate 16 of the station 10, with the outwardly directed flange 22 in seating relation to the confronting wall defining the opening 18. A tooling plate 26 having a central opening generally designated 28 provided therethrough is mounted in seating relation to the inwardly directed flange 24 of the tooling ring 20. An optical window 30 is removably mounted in seating relation in the opening 28 of the tooling plate 26.

A probecard 32 having a plurality of depending electrode fingers 34 is removably mounted to the inside surface of the tooling plate 26 as by threaded fasteners, not shown. Automatic testing equipment, not shown, is connected to the electrodes 34 via flexible electrical connectors 36 that are fed through openings provided therefor in the tooling plate 26. The ATE may be placed on the top of the station 10, on the tooling plate 26, and on the top plate 16, and its weight is transferred to and supported by the structural members of the frame. Different thickness probecards 32 may be directly mounted to the tooling plate 26.

An X, Y, Z, and $\theta$ movable chuck generally designated 40 is illustrated in FIG. 2 in its test position subjacent the probes 34 of the probecard 32. In its test position, an operator, schematically illustrated at 42, is able to view probe card finger alignment and the rest via optics 44 through the window 30. The optics 44 may be a microscope mechanically articulated to the cryogenic probe station 10 in any suitable manner.

Figure 3:
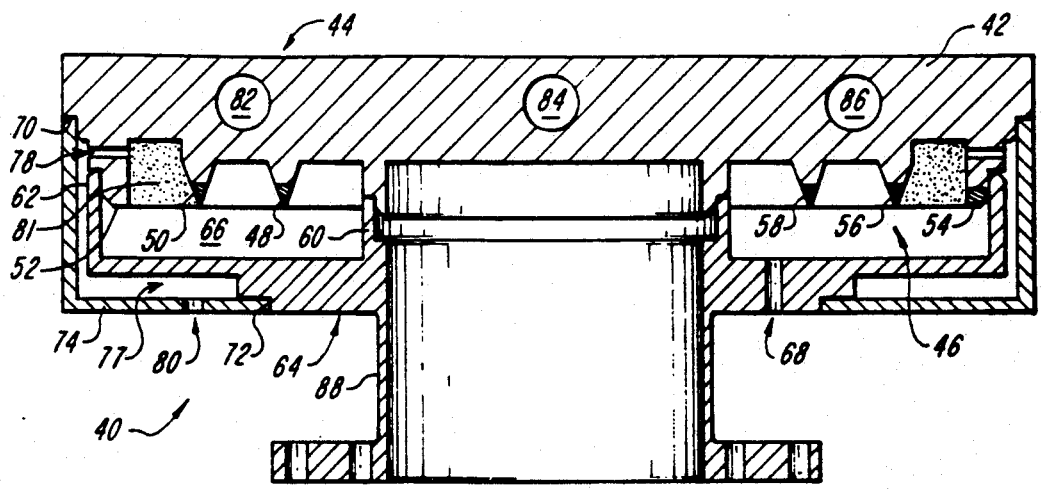
FIG. 3 is a sectional view through a diameter of the chuck of the improved cryogenic probe station of the present invention.

Referring now briefly to FIG. 3, the chuck 40 includes a metallic disc 42 having a generally planer semiconductor wafer receiving face generally disignated 44, and an opposing heat exchanging face generally designated 46. In the embodiment illustrated in FIG. 3, the heat exchanging face is constituted as a plurality of concentric rings 48, 50, 52 the proximate ends of which all terminate in a common plane and the wall members of which have a cross-section that tapers to their ends. The rings 48, 50, 52 are of the same material as and are machined into the chuck disc 42. The rings 48, 50, 52 may also be fashioned from a material different from the material of the chuck disc 42 wholly or partly along their elongation. If the disc 42 is copper, the free ends of the rings may have stainless steel tips 54, 56, 58. The different cross-sections with length, and/or the different materials along their lengths, provide different coefficients of conductive heat transport.

The disc 42 of the chuck 40 is seated on and fastened to radially spaced and upstanding inner and outer annular flanges 60, 62 of chuck cup member generally designated 64. The inner and outer flanges 60, 62 and their included wall, together with the heat exchanging face 46 of the chuck 42, provide an annular plenum generally designated 66 into which liquid nitrogen is flowed and in which it is allowed to boil. An input fluid flow conduit port generally designated 68 is provided through the cup 64 that is in fluid communication with the plenum 66. A shoulder 70 is provided about the circumference of the chuck disc 42, and a shoulder 72 is provided about the lower circumference of the chuck cup 64. An annulus 74 having a "L"-shaped cross-section is seated in and fastened to the shoulders 70, 72 of the chuck disc 42 and chuck cup 64. The inside walls of the annulus 74 together with the confronting outside walls of the chuck cup 64 define an annular exhaust plenum generally designated 77 that extends around the periphery of the chuck 40. A plurality of liquid nitrogen exhaust holes generally designated 78 are provided radially through the outermost one of the concentric rings of the heat exchanging face 46 of the chuck disc 42 that provide fluid communication between the plenum 66 and the plenum 77. Typically, about thirty such exhaust holes are provided. An exhaust fluid flow conduit port generally designated 80 is provided through the annulus 74 in fluid communication with the plenum 77.

The plenum 66 may be filled with steel wool schmatically illustrated at 81 to prevent boiling splatter from directly impacting the chuck underside to improve temperature stability at comparatively higher temperatures, and to prevent splatter from being blown directly into the exhaust holes 78 to conserve the amount of liquid nitrogen usage. A screen, not shown, is provided in the plenum 66 across the ends of the rings 48, 50, 52 to further control boiling. A thermal jacket, not shown, is provided peripherally around the side wall of the chuck 40. A plurality of apertures dimensioned to receive electrical resistance heaters generally designated 82, 84, and 86 are provided through the chuck disc 42. The apertures may be parallel to each other, as illustrated, or radially provided, not shown, through the chuck disc 42. The underside of the chuck disc is provided with four etched radial grooves, not shown, to provide fluid flow paths between the remote surface of the heat exchanging face 46 and the peripheral liquid nitrogen exhaust holes 78.

As shown in FIGS. 2 and 3, the chuck cup member 64 is mounted to a pedestal 88 that is mounted for movement in X, Y, Z, and $\theta$ with chuck base member 90. The pedestal 88 is journaled in a bearing and driven by a $\theta$ actuator, not shown, to provide $\theta$ rotation of the chuck over a predetermined angular range of rotation, and is operatively coupled to a Z acutator, not shown, to provide either up or down chuck motion to move the chuck into contact with the probes 34 for testing or away from the probe contacts 34 after testing of individual circuit devices.

Figure 4A:
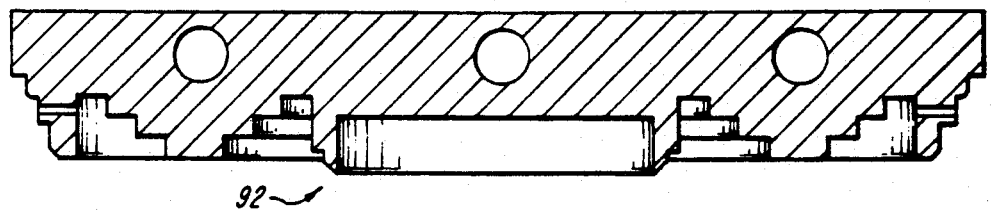
FIG. 4 illustrates in FIGS. 4A, 4B, and 4C thereof sectional views of alternative embodiments of the chuck of the improved cryogenic probe station of the present invention.

Referring now to FIG. 4A, an alternative embodiment of the chuck disc member is generally designated at 92. The heat exchanging face thereof is constituted as an annulus that symmetrically steps in three phases from its distal end to its remote end and in such a way as to exhibit a constant radial cross-section in each of the phases thereof. Again, the heat exchanger surface may be constructed of the same or different material from that of the chuck either wholly or in part along its length.

Figure 4B:
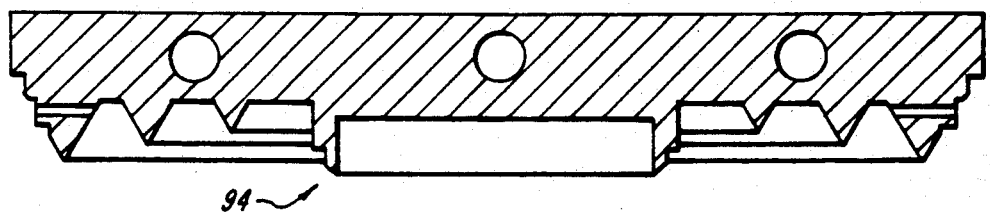

Referring now to FIG. 4B, another embodiment of the chuck disc member according to the present invention is generally designated at 94. The heat exchanging face of the FIG. 4B embodiment is constituted as a plurality of concentric rings, with radially outer rings being longer than radially inner rings, and with each ring having a "V"-shaped radial section. Like in the embodiments of FIGS. 3 and 4A, the material of the concentric rings may be the same or different from the material of the chuck disc member either wholly or partly along their lengths.

Figure 4C:
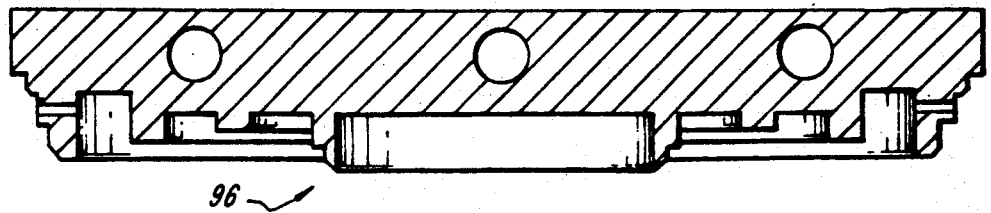

Referring now to FIG. 4C, generally designated at 96 is a further embodiment of a heat exchanging face of the chuck disc member in accordance with the present invention. Like for the FIG. 4B embodiment, the heat exchanging face illustrated in the FIG. 4C embodiment is constituted as a plurality of annuli, with radially outer annuli being longer than radially inner annuli, but which exhibit a constant radial cross-section along their lengths. The heat exchanging face 96 may be constituted of materials that are the same or different from the material of the chuck disc member either wholly or partly along its length.

Figure 5:
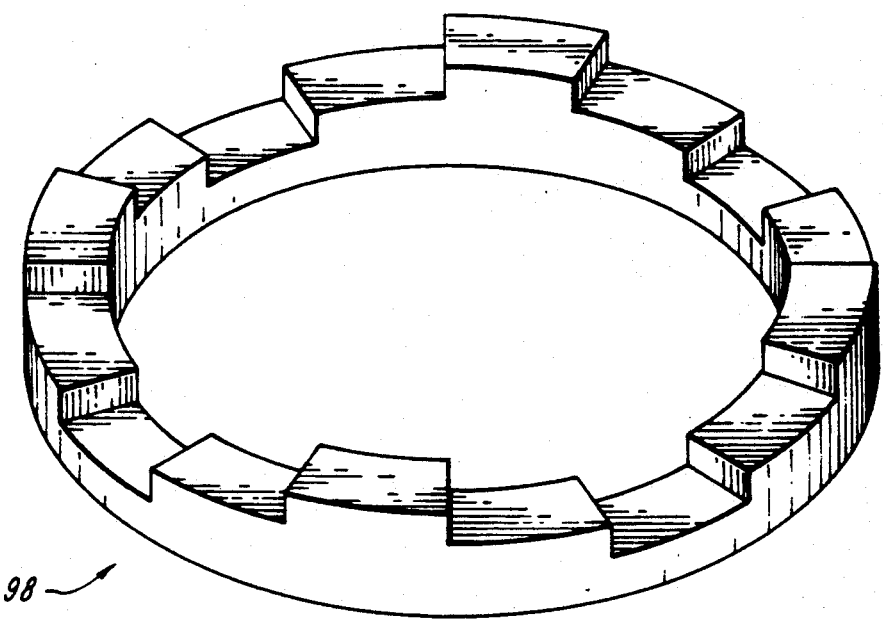
FIG. 5 is perspective view of a further embodiment of a chuck member constructed in accordance with the improved cryogenic probe station of the present invention.

Referring now to FIG. 5, generally designated at 98 is yet another embodiment of a heat exchanging face of the chuck disc member in accordance with the present invention. In this embodiment, the heat exchanging face is constituted as an annulus that circumference steps either up or down in three phases with change in angle about a given radius. Four flat peaks and four flat valleys symmetrically circumference arranged are illustrated, although any number of peaks and valleys may be employed. The heat exchanging face of the FIG. 4C embodiment exhibits a uniform radial cross-section at any given angle, although it will appreciated that a varying cross-section such as a tapering cross-section can be employed as well. Again, the material of the heat exchanging face may be the same or different from that of the chuck disc member either wholly or partly along its length.

Other heat exchanging face embodiments are contemplated, and are only limited to any such embodiment that has a preselected parameter selected such that the coefficient of heat transport rate provided by the heat exchanging face varies along the dimension of its extension whether that parameter is associated with material, geometry, or otherwise.

Returning now to FIGS. 1 and 3, the fluid flow input port 68 is connected to a source 100 of pressurized liquid nitrogen via conduits 102, 104, 106 respectively interconnected via flex joints generally designated 108, 110, and 112. An on/off valve 114 is provided immediately downstream of the pressurized source of liquid nitrogen 100 and a variable orifice 116 is provided immediately upstream of the valve 114. The chuck 40 is connected to atmosphere along an exhaust output fluid flow path having conduits 118, 120, and 122 respectively interconnected by the flex joints 108, 110, and 112. Downstream of the flex joint 112 an exhaust heater 124 is provided for expanding the liquid nitrogen in the output fluid flow path. A three-way valve 126 is positioned downstream of the exhaust heater 124. The three-way valve 126 has one state that vents the exhaust to atmosphere, as marked, and another state that connects the fluid flow output conduit to atmosphere via a vacuum pump 128 relieved by a pressure valve 130. Liquid nitrogen supplied into the input port 68 flows into the plenum 66 of the chuck at a rate that is determined by the size of the variable orifice 116. In dependance on the rate, it fills the plenum to different levels, and is in contact with a varying surface area of the heat exchanging face 46. As it boils, it is exhausted through the exhaust holes 78, exits the exhaust port 80 via the plenum 77, and is either discharged to atmosphere via the valve 126 or is coupled to the vacuum pump 128. The pump 128, selected for maximum low temperature operation, reduces the boiling point of the liquid nitrogen, thereby enabling lowered set point temperatures to be achieved.

A temperature sensor 130 is embedded in the chuck 40 and coupled to a temperature controller 132. The temperature controller 132 is responsive to a set point temperature as marked, and to the temperature of the chuck provided by the sensor signal, to control driver circuitry 134 connected to electrical resistance heaters 136 embedded in the apertures 82, 84, 86 provided therefor in the chuck disc 42. The driver 134 varies the power level to the heaters, and is preferably a linear non-switching D.C. amplifier that minimizes electrical noise at the chuck, which could affect sensitive measurements. A.C. power and on-off controllers or other driver circuitry could be used if electrical noise is not a problem. A motor controller 138 is responsive to the driver output signal to control a motor 140 that varies the orifice size of the variable orifice valve 116. The motor controller 138 has adjustable, preselected upper and lower bounds respectively marked "$T_u$, $T_l$".

The temperature set point may be selected to be any temperature within a range of temperatures from 75 K.° to as high as 425 K.° with a temperature stability of $+/-0.5$ K.°. The temperature of the chuck is established at any set point within the range of temperatures and maintained there in dependance on the electrical heater load, the liquid nitrogen flow rate, and the operative heat transfer coefficient being exhibited by the heat exhanging face of the chuck disc member.

The preselected lower temperature bound "$T_l$" of the motor controller is selected such that there is always delivered to the electrical resistance heaters that minimum power that allows the heat produced thereby to insulate the temperature of the chuck against temperature instability associated with uncontrolled and undesired boiling, as occurs, for example, in the flow paths, and against other liquid nitrogen introduced instabilities. Where maximum cold temperature operation is important, or where temperature stability is not important, the lower bound may be set arbitrarily low.

The preselected upper bound "$T_u$" of the motor controller is selected such that the deadband defined between it and the lower bound is sufficient to provide intended temperature stability at a given temperature set point by only varying the load of the electrical resistance heaters while maintaining a constant value for the size of the variable orifice of the variable orifice valve 116. In this manner, the usage of liquid nitrogen is kept at the minimum required to establish any set point temperature for a given temperature stability. Different deadbands may be employed for operation in different temperature regimes.

Figure 6C:
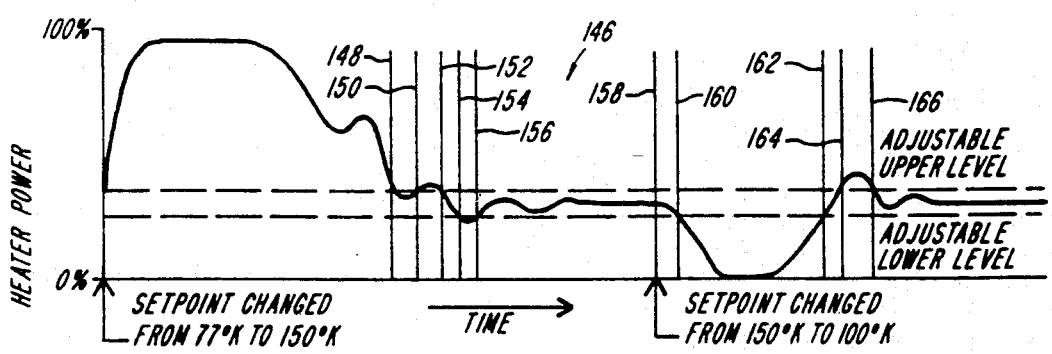
FIG. 6 illustrates graphs in FIGS. 6A, 6B, and 6C thereof useful in explaining temperature control in accordance with the improved cryogenic probe station of the present invention.
Figure 6B:
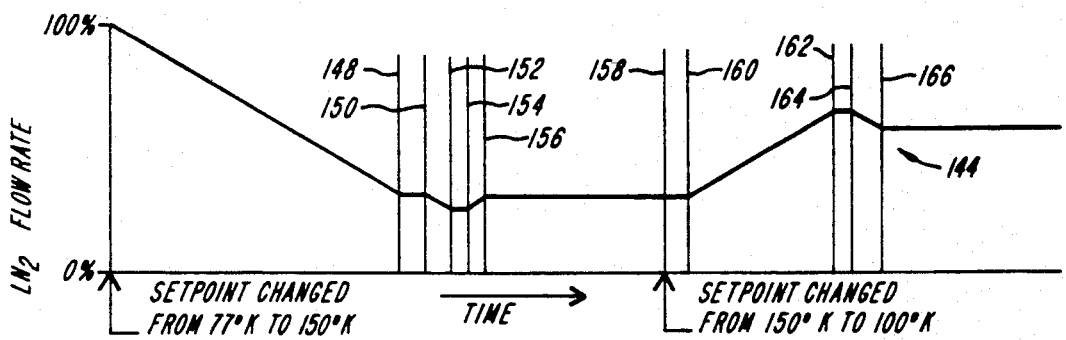
Figure 6A:
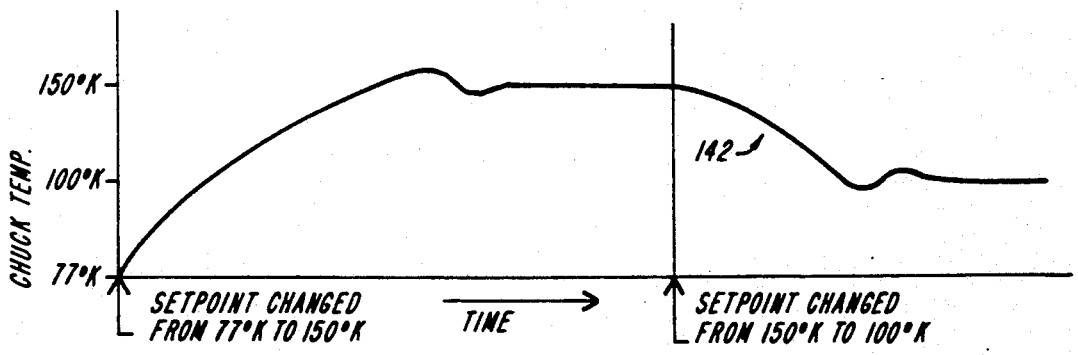

Referring now to FIG. 6, generally designated at 142 in FIG. 6A is a graph of chuck temperature plotted against time, generally designated at 144 in FIG. 6B is a graph of percentage of liquid nitrogen flow rate plotted against time, and generally designated at 146 in FIG. 6C is a graph of percentage of heater power plotted against time. In a first instance, the graphs 142, 144, 146 illustrate operation for an exemplary change in temperature set point from 77 K.° to 150 K.°. At the 77 K.° temperature set point, the vacuum pump is turned off, the heater power is turned off, and a fully dilated value is supplied to the variable orifice valve. The maximum rate of liquid nitrogen is then supplied by the liquid nitrogen source, the liquid nitrogen substantially fills the chuck plenum, and thereby the wafer testing surface thereof is tied to 77 K.° by conductive heat transport. When the temperature controller receives the change to the 150 K.° set point temperature, it turns the heater power fully "on" so as to deliver maximum heating power to the chuck via the linear amplifier driver connected to the electrical resistance heaters. In response to the heater power being above the upper temperature bound, the motor controller linearly ramps the variable orifice valve to a more throttled condition via the motor connected thereto. As the heating increases and the cooling rate decreases, the temperature of the chuck approaches set point temperature. With less flow of liquid nitrogen, less heater power is required. The motor controller continues to linearly throttle the size of the variable orifice valve until the electrical resistance heater's load falls within the deadband of the motor controller as illustrated by line 148, whereupon the liquid nitrogen flow rate is stabilized by turning the motor controlling the variable orifice valve off. As illustrated by a line 150, the percentage of heater power corresponding to the load being sensed once again exceeds the upper bound, and the motor is again actuated to throttle the variable orifice further. With lessened liquid nitrogen flow rate, lesser heater power is required, and as illustrated by a line 152, the percentage of heater power corresponding to the electrical resistance heater load falls into the deadband of the motor controller, whereupon the motor is again turned off again giving another constant liquid nitrogen flow rate. With stabilized lessened flow rate, the heater load is reduced, and as illustrated by a line 154, as soon as the percentage of heater power corresponding to the electrical resistance heater load drops below the lower bound of the deadband of the motor controller, the motor linearly dilates the variable orifice valve, producing a corresponding increase in the percentage of liquid nitrogen flow rate. This process continues until the percentage of heater power crosses back into the deadband of the motor controller as illustrated by a line 156, whereupon, the liquid nitrogen flow rate is again maintained at a uniform value. As illustrated by a line 158, the set point temperature is then maintained solely by varying the percentage of electrical resistance heater power at the 150 K.° set point temperature.

In a second instance, the graphs 142, 144, 146 illustrate operation for an exemplary change in set point temperature from 150 K.° to 100 K.°. As also illustrated by the line 158, the heater power is turned off, and the electrical resistance heater load falls outside the lower temperature bound of the motor controller upon receipt of this change in set point temperature. The flow rate of the liquid nitrogen remains constant until such time as the percentage of heater power crosses the lower temperature bound as illustrated by a line 160, whereupon, the motor controller ramps open the orifice of the variable orifice valve to cause a larger percentage of liquid nitrogen to be supplied to the chuck. As the flow rate of liquid nitrogen is increased, the temperature of the chuck approaches the lowered set point temperature, and the temperature controller again turns the electrical resistance heaters on. The electrical resistance heaters load crosses the lower bound as shown by a line 162, whereupon, the liquid nitrogen flow rate is stabilized. As illustrated by a line 164, if the percentage of heater power exceeds the upper bound, the percentage flow rate of liquid nitrogen is reduced. The temperature of the chuck accordingly rises, requiring less heater power, until the electrical resistance heater load is pulled back down again into the deadband of the motor controller. As illustrated by a line 166, operation at the higher set point temperature is then maintained by only varying the load to the electrical resistance heaters.

Referring now again to FIGS. 1 and 2, the base 90 of the chuck 40 has an air bearing illustrated in dashed outline 170 on which it rides over the confronting surface of a surface plate generally designated 172, and has an air bearing generally designated 174 on a side surface thereof on which it rides along the confronting upstanding wall of a T-slide generally designated 176. The T-slide has air bearings illustrated in dashed outline 178 on its undersurface on which it rides over the confronting surface of the surface plate 172. The cross member 179 of the T-slide 176 has upstanding air bearings illustrated in dashed outline 180 on which it rides along the confronting upstanding surface of the surface plate 172. An X actuator and position sensor, not shown, are provided for sliding the chuck against the confronting surface of the T-slide to assume any intended surface plate X coordinate, and a Y actuator and position sensor, not shown, are coupled to the T-slide for causing the T-slide, and therewith the chuck, to assume any intended surface plate Y coordinate.

Figure 7A:
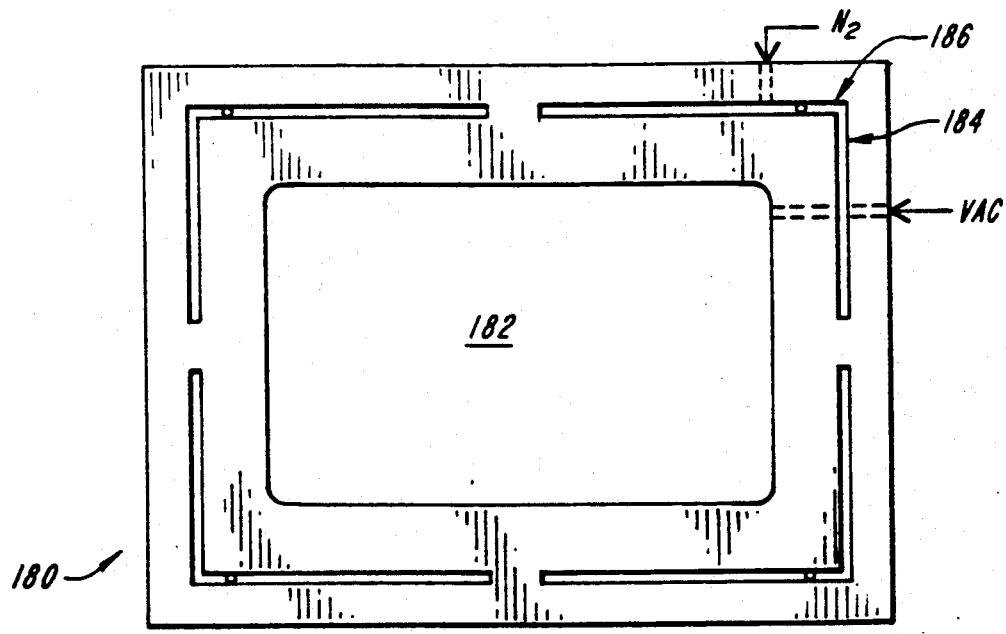
FIGS. 7a and 7b are bottom plan views of an air bearing constructed in accordance with the improved cryogenic probe station of the present invention.
Figure 7B:
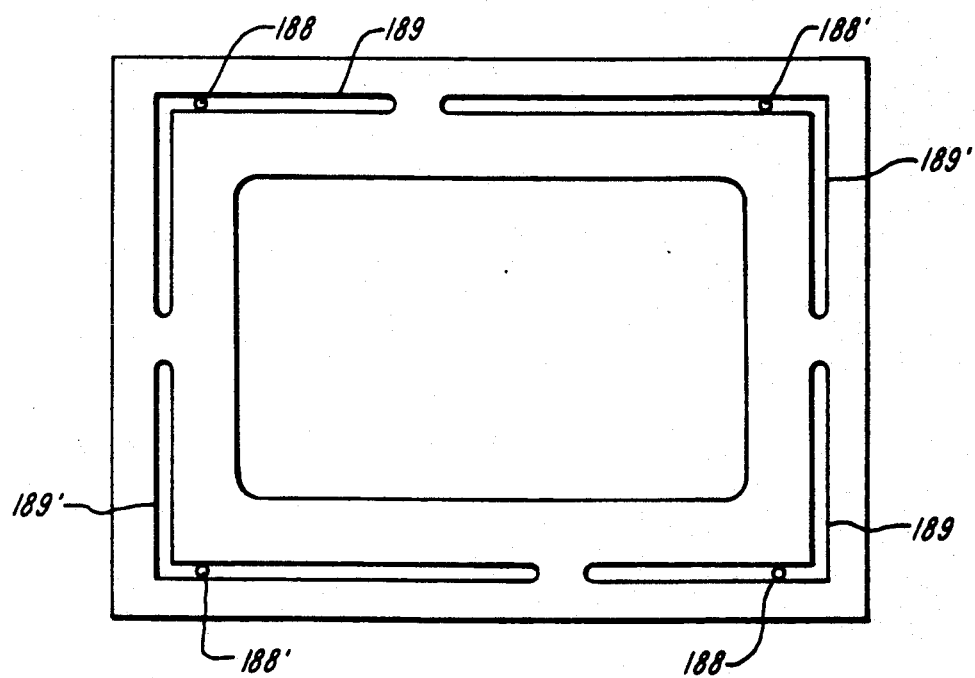

Referring now to FIG. 7, generally designated at 181 is a preferred embodiment of any one of the air bearings 170, 174, 178 and 181. The air bearing 180 includes a central vacuum pad generally designated 182 and a four-segment channel generally designated 184 symmetrically disposed surrounding the central vacuum pad 182. Each of the segments includes a metered orifice generally designated 186. Vacuum imparted to the vacuum pad 182 draws the bearing 181 to its confronting surface. Metered nitrogen is supplied through the four-segment channel, and pushes the same confronting surface away from the air bearing. The symmetrical distribution of the four-segment channel provides uniform repulsive force about the four corners of the bearing, while the central vacuum pad provides uniform attractive force. The metered orifices 186, in each of the symmetrically disposed segments, provide constant gas flow no matter what the load distribution on the bearing plate might be. The air bearing 181 thus exhibits a gap dimension that is stable against unequal and equal load distributions about the bearing surface. Where the natural frequency of the air bearing produces instability, the dynamic stability of the bearing can be increased by turning each air bearing channel to a different natural frequency by slightly differing orifice sizes or differential bearing geometry, such as groove dimensions, or by varying the pressure of the gas to the metering orifices. While four segments are shown, a smaller number, not less than three, or a greater number, can be employed, so long as all or most of the segments have their own metered supply of gas. The dynamic equilibrium established by the play between the negative vacuum and positive gas pressures holds the confronting surfaces together while permitting their relative sliding movement in such a way that the confronting surfaces are themselves held together in spaced apart relation with no other constraining members being required. When the gas is turned off, the vacuum sucks the confronting surfaces together, providing absolute positional stability in the X, Y and Z direction.

Referring once again to FIGS. 1 and 2, the surface plate 172 is mounted on uprights 190 that are slidably mounted for up and down Z movement to frame bottom member 12. The height of the surface plate is adjustable manually by micrometer adjustment posts, not shown, and/or automatically by a Z actuator, not shown, to that Z position that accommodates the particular thickness of the probe card 32 being employed for a specific test configuration.

A transfer mechanism generally designated 192 has base generally designated 193 thereof mounted for Z movement with the surface plate 172. The transfer mechanism 192 includes an arm 194 pivotably mounted on a post 196 journaled in base member 194. The arm 194 of the transfer mechanism 192 pivots between a load-lock position illustrated in solid line, and a transfer position illustrated in dashed outline. A load-lock chamber generally designated 200 is provided adjacent the front wall of the improved cryogenic probe station, and it includes an outer pivoting door illustrated in dashed line 202 and an inner pivoting door illustrated in dashed line 204. A cassette carrier 206 that is pivotally mounted on a shaft 208 journaled for rotation in the base member 193 of the transfer mechanism 192 is positioned in the load-lock 200 and accepts a cassette 210 that is able to accept a plurality of semiconductor wafers therein. A cam 212 is mounted for rotation with the shaft 196 of the transfer mechanism 192, and a cam follower 214 in bearing relation to the cam 212 is attached via an arm 215 to the pivoting shaft 208 of the carrier tray 206.

In operation, the arm 194 of the transfer mechanism is raised to a height corresponding to a selected wafer position of the cassette as illustrated in dashed line in FIG. 2, and as it pivots thereto or therefrom about its pivot 196, the carrier tray 206 follows the pivoting motion via the cam follower 212 to align the mouth of the cassette with the arc of the transfer arm thereby enabling contact-free wafer insertion and removal. The load-lock 200 is purged with a nitrogen gas stream at positive pressure to prevent moisture condensation. The outer door 202 and inner door 204 enable cassette placement and removal while testing is underway. As illustrated in dashed outline 212, the cryogenic probe station is maintained at a positive nitrogen pressure to prevent moisture condensation upon the operative surfaces of the cryogenic probe station.

While liquid nitrogen is disclosed in the preferred embodiments, other liquefied gases such as liquid helium or liquid $H_2$ could be employed as well without departing from the inventive concept.

The present invention has application to testing any circuit device borne on any type of substrate and is not limited to the integrated circuit devices on the semiconductor wafers as in the examplary embodiments. Superconducting materials, ceramic based large scale integrated circuits and infrared sensing devices are contemplated.

Many modifications of the presently disclosed invention will be apparent to those skilled in the art without departing from the inventive concept.

What is claimed is:

1. A test station accepting probe cards and testing substrates having plural integrated circuits thereon to be tested that are received for testing on a platform that is movable step-wise in X and in Y to bring the integrated circuit devices individually into operative proximity to the probe cards at different X, Y coordinates, and for holding the platform absolutely stable in Z at any X, Y coordinate, comprising:

a surface plate;
a platform for receiving the substrate to be tested;
an air/vacuum bearing supplied by air at a positive pressure and supplied by vacuum simultaneously at a negative pressure mounted between the platform and the surface plate for allowing the platform to ride on an air bearing in X, and in Y to any X, Y coordinate of the surface plate while air and vacuum are supplied, and for holding the platform absolutely stable in Z when air is not supplied but vacuum is;
wherein said air/vacuum bearing includes a member confronting the surface plate having a substantially flat bearing surface, a central vacuum pad formed in the flat bearing surface, at least three gas-supplied channels formed substantially symmetrically around the vacuum pad, and at least three metered gas-supplied orifices formed in respective ones of the at least three gas channels to provide a preselected, constant rate of gas supply that is independent of bearing load;

wherein vacuum supplied to the vacuum pad draws the bearing to the surface plate while air supplied through the at least three gas-supplied channels pushes the same confronting surface of the surface plate away from the air/vacuum bearing;

wherein the substantially symmetrical distribution of the gas-supplied channels about the central vacuum pad provides uniform repulsive force about corners of the bearing, while the central vacuum pad provides uniform attractive force, which, in cooperation with the metered orifices that each provide a constant rate of gas supply no matter what load distribution on the bearing might be, enables the air/vacuum bearing to exhibit a gap dimension that is stable against unequal and equal load distributions about the bearing.

2. The invention of claim 1, wherein said platform is a controlled temperature platform.

3. The invention of claim 2, wherein said controlled temperature platform is both supplied with a stream of liquified gas and with electrically produced heat.

4. The invention of claim 1, wherein said air/vacuum bearing further includes means for tuning the air/vacuum bearing to a selected natural frequency.

5. The invention of claim 4, wherein said tuning means includes differential bearing geometry.

6. The invention of claim 5, wherein said differential bearing geometry of said tuning means include slightly differing orifice sizes.

7. The invention of claim 5, wherein said differential bearing geometry of said tuning means include slightly differing channel dimensions.

8. The invention of claim 4, wherein said turning means includes means for varying the pressure of the gas supplied to the metering orifices.

* * * * *